(12) United States Patent
Deng

(10) Patent No.: US 10,302,822 B1
(45) Date of Patent: May 28, 2019

(54) DISPLAY AND DISPLAY PANEL THEREOF

(71) Applicant: Wuhan China Star Optoelectronics Technology Co., Ltd., Wuhan, Hubei (CN)

(72) Inventor: Zefang Deng, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/945,312

(22) Filed: Apr. 4, 2018

Related U.S. Application Data

(63) Continuation of application No. PCT/CN2018/073058, filed on Jan. 17, 2018.

(30) Foreign Application Priority Data

Dec. 27, 2017  (CN) .......................... 2017 1 1450390

(51) Int. Cl.
*H01L 51/52* (2006.01)
*G02B 3/04* (2006.01)
*G02F 1/1335* (2006.01)

(52) U.S. Cl.
CPC ......... *G02B 3/04* (2013.01); *G02F 1/133526* (2013.01); *H01L 51/5275* (2013.01)

(58) Field of Classification Search
CPC ... H01L 51/52; H01L 51/527; H01L 51/5275; G02F 1/133526; G02B 3/04

USPC .......................................................... 257/40
See application file for complete search history.

(56) References Cited

U.S. PATENT DOCUMENTS 9,818,967 B2 * 11/2017 Ma .......................... H01L 51/52

FOREIGN PATENT DOCUMENTS

| CN | 103852972 | 6/2014 |
| CN | 104808268 | 7/2015 |
| CN | 106249426 | 12/2016 |
| CN | 106501885 | 3/2017 |
| CN | 106842597 | 6/2017 |
| JP | 2000-5892 | 1/2000 |

* cited by examiner

*Primary Examiner* — Monica D Harrison
(74) *Attorney, Agent, or Firm* — Hauptman Ham, LLP

(57) ABSTRACT

The present disclosure provides a display and a display panel thereof. The display panel includes a display assembly, a microlens structure disposed on the display assembly. The microlens structure includes a substrate and a microlens array. The microlens array is disposed on the surface of the substrate away from the display assembly. The microlens array includes a plurality of microlenses arranged in an array, and shapes of the microlens are formed by rotating a plurality of continuous curves around an axis. By setting the shape of the microlens to be a shape formed by rotating a plurality of continuous curves around an axis, the parallel light emitted by the display assembly can be converged to two focal points, the depth of field displayed by the light field 3D can be increased, the 3D display effect can be improved.

10 Claims, 2 Drawing Sheets

DISPLAY AND DISPLAY PANEL THEREOF

RELATED APPLICATIONS

The present application is a Continuation Application of International Application Number PCT/CN2018/073058, filed Jan. 17, 2018, and claims the priority of China Application No. 201711450390.2, filed Dec. 27, 2017.

FIELD OF THE DISCLOSURE

The present disclosure relates to a display technology field, and more particularly to a display and a display panel thereof.

BACKGROUND OF THE DISCLOSURE

Light field 3D display technology is the rise of popular naked eye 3D display technology in recent years, which is based on the basic principle of four-dimensional light field reproduction. The four-dimensional light field refers to the information in the space that includes the direction information in addition to the three-dimensional coordinate information of the space of the exit point. Therefore, ray information with direction must be recorded to completely restore the 3D scene. Usually, a ray of light is uniquely represented by recording the coordinates of the intersection of the space light and the two planes parallel to each other. As shown in FIGS. 1, A and B are two planes parallel to each other in space, and light C is respectively intersected with two planes at $A_0(x_a, y_a)$ and $B_0(x_b, y_b)$. Through the intersection points on the two planes, the light direction information can be obtained, that is $A_0B_0(x_b-x_a, y_b-y_a)$, only need to re-trace the light to re-focus, restore the recorded three-dimensional scene, to achieve true three-dimensional display. At present, the microlens arrays are mainly used to record and restore the information of the light field so as to realize the three-dimensional display of the light field.

However, due to the convergence of light by the microlenses, light passes through the microlenses and forms a clear image only near the focal point. Leaving the focus, the sharpness of the image decreases rapidly, and the farther the out of focus position is, the worse the image clarity is, which greatly limits the depth of field of the 3D display. At present, in order to solve this problem, a multi-focal optical system design has been proposed so that the light can be focused at different positions to improve the depth of field of the display system. However, the existing multi-focus system structure is more complex, not suitable for system integration.

SUMMARY OF THE DISCLOSURE

In order to solve the deficiencies of the prior art, the present disclosure provides a display and a display panel thereof, which can increase the depth of field of the 3D display of the light field and improve the 3D display effect. The structure is simple, and the integration is easy.

The specific technical solution proposed by the present disclosure is: to provide a display panel, including a display assembly, a microlens structure disposed on the display assembly, wherein the microlens structure includes a substrate and a microlens array, the microlens array is disposed on the surface of the substrate away from the display assembly, the microlens array includes a plurality of microlenses arranged in an array, and shapes of the microlens are formed by rotating a plurality of continuous curves around an axis.

Optionally, the plurality of continuous curves include a first curve and a second curve, the microlens includes a first lens portion and a second lens portion, the first lens portion is formed by rotating the first curve around the axis, the second lens portion is formed by rotating the second curve around the axis, the second lens portion is located between the first lens portion and the substrate, and a line connecting the focal point of the first lens portion and the focal point of the second lens portion is perpendicular to the surface of the display assembly.

Optionally, cross sections of the first lens portion and the second lens portion are both arc shape.

Optionally, cross sections of the first lens portion and the second lens portion are both circular arc shape.

Optionally, the radius of the cross section of the first lens portion is smaller than that of the second lens portion.

Optionally, the display assembly is the liquid crystal display assembly or the OLED display assembly, and the display assembly has a plurality of pixels arranged in an array.

Optionally, the projection of the microlens array on the substrate completely covers the plurality of pixels.

Optionally, the spacing between any two adjacent microlenses in the microlens array is zero.

Optionally, the material of the substrate is the same as that of the microlens structure.

The present disclosure also provides a display, which includes the display panel as described above.

The display panel provided by the present disclosure includes a microlens structure including a substrate and a microlens array, the microlens array including a plurality of microlenses arranged in an array. The shape of the microlens is a shape formed by rotating a plurality of continuous curves around an axis. By setting the shape of the microlens to be a shape formed by rotating a plurality of continuous curves around an axis, the parallel light emitted by the display assembly can be converged to two focal points, the depth of field displayed by the light field 3D can be increased, the 3D display effect can be improved, and the structure of the microlens structure is simple and easy to integrate.

DETAILED DESCRIPTION OF PREFERRED EMBODIMENTS

Figure 1:
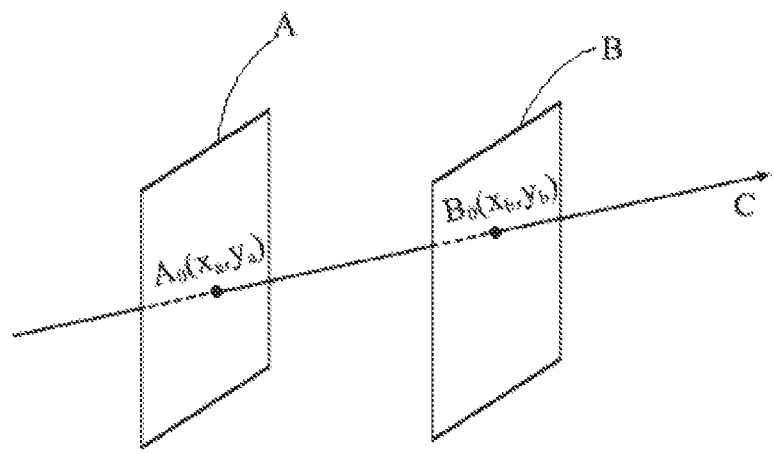
FIG. 1 is a schematic structural diagram of the display.

Hereinafter, embodiments of the present disclosure will be described in detail with reference to the accompanying drawings. However, the disclosure may be embodied in many different forms and should not be construed as limited to the specific embodiments set forth herein. Rather, these embodiments are provided to explain the principles of the disclosure and its practical application to thereby enable those of ordinary skill in the art to understand various embodiments of the disclosure and various modifications as are suited to the particular use contemplated. In the drawings, the same reference numerals will always be used to refer to the same elements.

Figure 2:
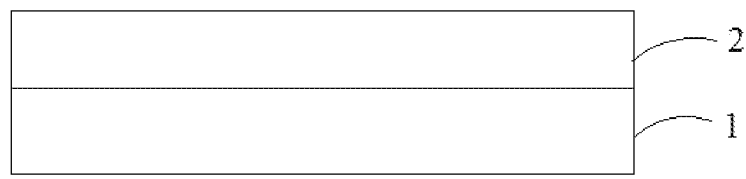
FIG. 2 is a schematic structural diagram of the display.
Figure 3:
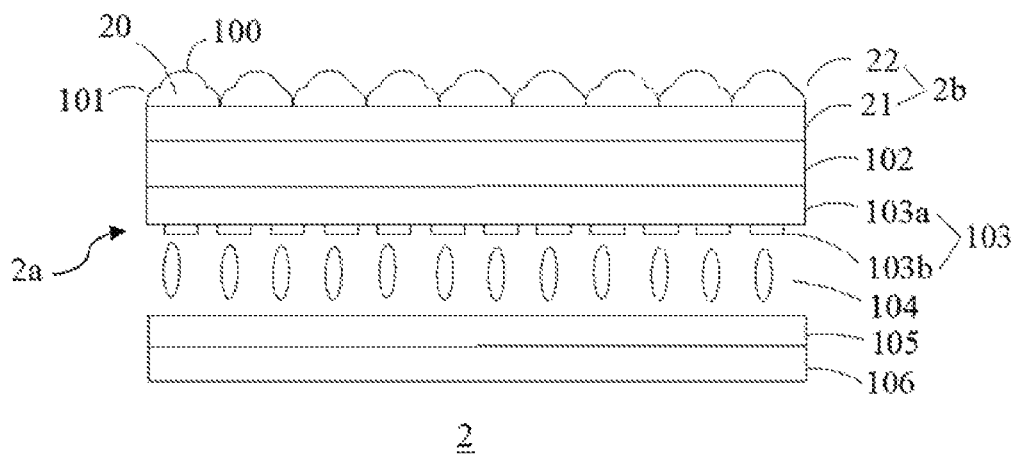
FIG. 3 is a schematic structural diagram of the display panel.

Referring to FIG. 2, FIG. 3, the display provided in this embodiment may be a liquid crystal display or an OLED. Here, a liquid crystal display is used as an example for the display in this embodiment. The display includes a backlight module 1 and a display panel 2. The backlight module 1 provides a light source for the display panel 2.

The display panel 2 includes a display assembly 2a and a microlens structure 2b disposed on the display assembly 2a. The microlens structure 2b includes a substrate 21 and a microlens array 22. The microlens array 22 is disposed on the surface of the substrate 21 away from the display assembly 2a. The microlens array 22 includes a plurality of microlenses 20 arranged in an array. The microlenses 20 have a shape formed by rotating a plurality of continuous curves around an axis. In the present embodiment, the axis refers to the optical axis of the microlens 20, and the distance from the focal point of the shape formed by rotating the plurality of continuous curves around an axis to the distance between the substrates 21 is not equal.

Specifically, the plurality of continuous curves includes a first curve and a second curve, the microlens 20 includes a first lens portion 100 formed by rotating a first curve around an axis and a second lens portion 101 formed by rotating a second curve around an axis. The second lens portion 101 is located between the first lens portion 100 and the substrate 21. A line connecting the focal point of the first lens portion 100 and the focal point of the second lens portion 101 is perpendicular to the surface of the display assembly 2a.

The parallel light emitted by the display assembly 2a converges to two focal points after passing through the first lens portion 100 and the second lens portion 101. Using the display panel in this embodiment in a light field 3D display device can increase the depth of field of the 3D display of the light field and improve the 3D display effect. In addition, the structure of the microlens structure 2b in this embodiment is simple and easy to integrate.

In this embodiment, both the first lens portion 100 and the second lens portion 101 are arc-shaped in cross section, and both the first lens portion 100 and the second lens portion 101 have a convex arc-shaped cross section, that is, the first curve and the second curve are convex arcs. The main optical axis of the first lens portion 100 and the main optical axis of the second lens portion 101 coincide with and perpendicular to the surface of the display assembly 2a, the first lens portion 100 and the second lens portion 101 are symmetrical with respect to the main optical axis for the two portions divided by the main optical axis.

Figure 4:
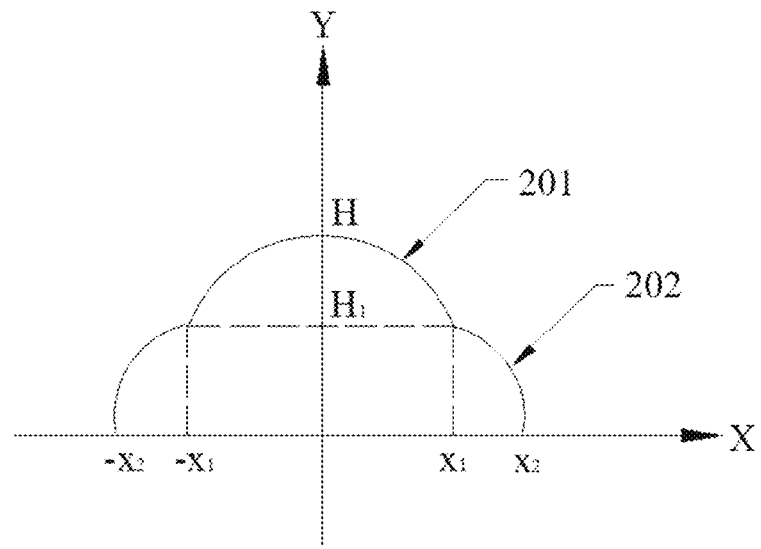
FIG. 4 is a schematic structural diagram of the cross section of the microlens.
Figure 5:
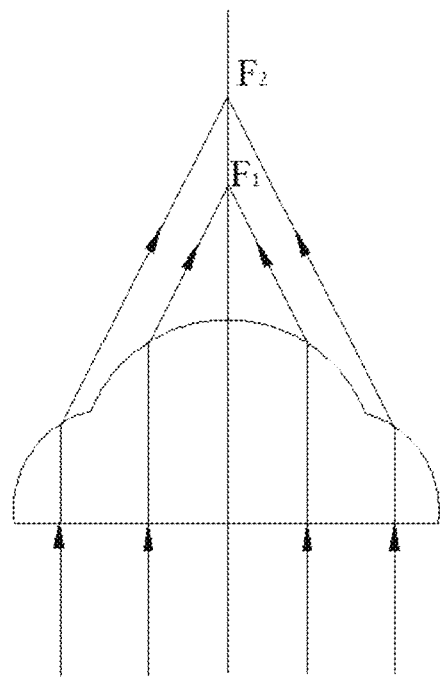
FIG. 5 is an exit light path of the microlens.

Referring to FIGS. 4, 5, cross sections of the first lens portion 100 and the second lens portion 101 are both arc shape, and each of the first lens portion 100 and the second lens portion 101 has a spherical crown shape, that is, the first curve and the second curve are both arc-shaped. The radius of the cross section of the first lens portion 100 is smaller than that of the second lens portion 101. The parallel light emitted by the display assembly 2a passes through the first lens unit 100 and converges to the focal point $F_1$. The parallel light emitted from the display assembly 2a passes through the second lens portion 101 and converges to the focus $F_2$.

A rectangular coordinate system is established by taking a straight line parallel to the display assembly 2a as the X axis and a surface perpendicular to the display assembly 2a as the Y axis. The X axis is located on the surface of the display assembly 2a, the Y axis is the main optical axis of the first lens portion 100. The circular arc 201 of the cross section of the first lens portion 100 and the circular arc 202 of the cross section of the second lens portion 101 can be expressed by the following formula:

$$Y = \sqrt{R_0^2 - X^2} + Y_0 (-x_1 \le X \le x_1)$$

$$Y = \sqrt{R_1^2 - X^2} + Y_1 (-x_2 < X \le -x_1, x_1 < X \le x_2)$$

$R_0$ is the radius of the circular arc 201, $Y_0$ is the ordinate of the center of the circular arc 201, $R_1$ is the radius of the circular arc 202, $Y_1$ is the ordinate of the center of the circular arc 202, and $R_0$, $Y_0$ satisfy the following relation:

$$R_0^2 - x_1^2 = (H_1 - Y_0)^2$$

$$H = R_0 + Y_0$$

Similarly, $R_1$, $Y_1$ satisfy the following relationship:

$$Y_1^2 = R_1^2 - x_2^2$$

$$R_1^2 - x_1^2 = (H_1 - Y_1)^2$$

Of course, the cross sections of the first lens portion 100 and the second lens portion 101 in this embodiment may also be other arcs, for example, parabolas. The arc shape of the cross section of the first lens portion 100 and the second lens portion 101 can be expressed by the following formula:

$$Y = \Sigma a_n |X|^n + a_0 \ (-x_1 \le X \le x_1)$$

$$Y = \Sigma b_n |X|^n b_0 \ (-x_2 \le X \le -x_1, x_1 \le X \le x_2)$$

The values of $a_n$, $b_n$, and n may be set according to actual situations, as long as the first lens portion 100 and the second lens portion 101 can converge the collimated light beams emitted by the display assembly 2a to two different focal points.

For the case that the display assembly 2a is a liquid crystal, it generally includes an upper polarizer 102, a CF substrate 103, a liquid crystal layer 104, a TFT array substrate 105 and a lower polarizer 106 which are sequentially disposed away from the substrate 21. The CF substrate 103 includes a substrate 103a and a plurality of pixel color filters 103b disposed on the surface of the substrate 103a. The plurality of pixel color filters 103b are disposed between the substrate 103a and the liquid crystal layer 104 and are formed by photolithography using different color (e.g. red R, green G, blue B) photoresists. In this embodiment, the micro lens array 22 and the substrate are directly attached to the surface of the upper polarizer 102. In some embodiments, there may be other structures between the substrate and the display assembly, such as a touch structure layer. The projection of the microlens array 22 on the substrate 103a completely covers the plurality of pixel color filters 103b. Preferably, the spacing between any two adjacent microlenses 20 in the microlens array 22 is zero, so that the light transmitted from the plurality of pixel color films all converges through the microlens array 22, thereby improving the light source utilization.

Of course, the microlens structure 2b in this embodiment can also be applied to other types of displays. The principle is the same as that of the liquid crystal display. It only needs to ensure that the micro lens structure 2b is located between the image display surface of the display assembly 2a and the observer in the whole display device, and details are not described herein again.

In this embodiment, the material of the substrate 21 is the same as the material of the microlens structure 2b, so that the light incident on the microlens array 22 is as parallel as possible so that all the light beams can converge to the focal point, thereby further improving the light source utilization. In some embodiments, the material of the substrate 21 and the micro lens structure 2b may be integrally formed.

The foregoing descriptions are merely specific implementation manners of the present application. It should be noted that those skilled in the art may make various improvements and modifications without departing from the principle of the present application, and these improvements and modifications should also be considered as falling within the protection scope of the present application.

What is claimed is:

1. A display panel, comprising a display assembly, a microlens structure disposed on the display assembly, wherein the microlens structure comprises a substrate and a microlens array, the microlens array is disposed on a surface of the substrate away from the display assembly, the microlens array comprises a plurality of microlenses arranged in an array, and shapes of the microlens are formed by rotating a plurality of continuous curves around an axis;

wherein the plurality of continuous curves comprise a first curve and a second curve, the microlens comprises a first lens portion and a second lens portion, the first lens portion is formed by rotating the first curve around the axis, the second lens portion is formed by rotating the second curve around the axis, the second lens portion is located between the first lens portion and the substrate, and a line connecting a focal point of the first lens portion and a focal point of the second lens portion is perpendicular to a surface of the display assembly;

wherein cross sections of the first lens portion and the second lens portion are both circular arc shape and a radius of a circular arc of the cross section of the first lens portion is smaller than that of the second lens portion.

2. The display panel according to claim 1, wherein the display assembly is a liquid crystal display assembly or an OLED display assembly, and the display assembly has a plurality of pixels arranged in an array.

3. The display panel according to claim 2, wherein a projection of the microlens array on the substrate completely covers the plurality of pixels.

4. The display panel according to claim 3, wherein a spacing between any two adjacent microlenses in the microlens array is zero.

5. The display panel according to claim 1, wherein a material of the substrate is the same as that of the microlens structure.

6. A display, comprising a display panel, wherein the display panel comprises a display assembly, a microlens structure disposed on the display assembly, wherein the microlens structure comprises a substrate and a microlens array, the microlens array is disposed on a surface of the substrate away from the display assembly, the microlens array comprises a plurality of microlenses arranged in an array, and shapes of the microlens are formed by rotating a plurality of continuous curves around an axis;

wherein the plurality of continuous curves comprise a first curve and a second curve, the microlens comprises a first lens portion and a second lens portion, the first lens portion is formed by rotating the first curve around the axis, the second lens portion is formed by rotating the second curve around the axis, the second lens portion is located between the first lens portion and the substrate, and a line connecting a focal point of the first lens portion and a focal point of the second lens portion is perpendicular to a surface of the display assembly;

wherein cross sections of the first lens portion and the second lens portion are both circular arc shape and a radius of a circular arc of the cross section of the first lens portion is smaller than that of the second lens portion.

7. The display according to claim 6, wherein the display assembly is a liquid crystal display assembly or an OLED display assembly, and the display assembly has a plurality of pixels arranged in an array.

8. The display according to claim 7, wherein a projection of the microlens array on the substrate completely covers the plurality of pixels.

9. The display according to claim 8, wherein a spacing between any two adjacent microlenses in the microlens array is zero.

10. The display according to claim 6, wherein a material of the substrate is the same as that of the microlens structure.

* * * * *